(12) United States Patent
You

(10) Patent No.: US 6,277,670 B1
(45) Date of Patent: Aug. 21, 2001

(54) SEMICONDUCTOR CHIP PACKAGE AND FABRICATION METHOD THEREOF

(75) Inventor: Joong Ha You, Cheonju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/416,272

(22) Filed: Oct. 12, 1999

Related U.S. Application Data

(62) Division of application No. 08/923,817, filed on Sep. 4, 1997, now Pat. No. 5,994,783.

(30) Foreign Application Priority Data

Sep. 11, 1996 (KR) .................................. 96-39240

(51) Int. Cl.[7] ........................... H01L 21/44; H01L 21/48; H01L 21/50
(52) U.S. Cl. ........................... 438/106; 438/455; 438/613
(58) Field of Search .................................. 438/106, 455, 438/456, 612, 613

(56) References Cited

U.S. PATENT DOCUMENTS

| | | | |
|---|---|---|---|
| 5,046,161 | 9/1991 | Takada | 357/69 |
| 5,600,180 | 2/1997 | Kusaka et al. | 257/692 |
| 5,629,564 | 5/1997 | Nye, III et al. | 257/762 |

FOREIGN PATENT DOCUMENTS

| | | | |
|---|---|---|---|
| 401209746A | 8/1989 | (JP) | 257/778 |

OTHER PUBLICATIONS

Jadus, Flip chip terminal for semiconductor devices, IBM Technical Disclosure Bulletin v. 21, No. 3, p. 1007, 8/78.

Technical Proceedings, SEMI Technology Symposium, Session 6, Packaging Technology, pp. 497–505 (Dec. 2, 1994) Mitsubishi Corporation.

Primary Examiner—Kevin M. Picardat
Assistant Examiner—D. M. Collins
(74) Attorney, Agent, or Firm—Fleshner & Kim, LLP

(57) ABSTRACT

A chip package according to an embodiment of the present invention includes an integrated chip having a plurality of chip pads formed thereon, and a passivation film formed in such a manner that the chip pads are exposed. A plurality of metal wirings are connected to the chip pads on the upper surface of the passivation film, and externals balls electrically connected to the metal wirings. A molding resin layer is formed on the upper portion of the semiconductor chip such that the upper surfaces of the external balls protrude therefrom.

13 Claims, 7 Drawing Sheets

US 6,277,670 B1

SEMICONDUCTOR CHIP PACKAGE AND FABRICATION METHOD THEREOF

This application is a Divisional of application Ser. No. 08/923,817 filed Sep. 4, 1997 now U.S. Pat. No. 5,994,783.

BACKGROUND OF THE INVENTION

1. Field of the Invention

The present invention relates to a package and a fabrication method thereof, and in particular, to an improved integrated chip package and the fabrication method thereof.

2. Background of the Related Art

FIG. 1 is a perspective view showing a partly cut away PMEB (Plastic Molded Extended Bump) type chip-size semiconductor package. As shown in this drawing, a metal wiring pattern 13 is formed to connect a plurality of chip pads 12 formed on the semiconductor chip 11 with internal bump bonding pads 17. Conductive internal bumps 16 are attached on the internal bump bonding pad 17 and tapes (not shown) are attached to the top surfaces of the conductive internal bumps 16. Then the semiconductor chip 11 is surrounded and molded with a molding resin 14. When the tapes are removed, the top surfaces of the internal bumps 16 are exposed. A solder paste is applied on the internal bumps 16, external electrode bumps 15 are placed thereon and the external bumps 15 and the internal bumps 16 are attached through an infrared reflow process, resulting in a completed PMEB-type chip-size semiconductor package, a description of which was published at the "SEMICON JAPAN '94 SYMPOSIUM" held by the MITSUBISHI corporation in Japan.

FIG. 2 is a cross-sectional view of a bump electrode in FIG. 1. The chip pads 12 are formed on the top surface of the semiconductor chip 11, and a passivation film 18 is formed on the semiconductor chip 11, except on the top surface of the chip pads 12. The metal wiring pattern 13 is formed on the chip passivation film 18, wherein one end of the metal wiring pattern 13 is connected to the chip pad 12 and the other end thereof 13 is connected to the internal bump bonding pad 17. A polyimide film 10 is formed on the above construction, except at the internal bump connecting pads 17, and the internal bumps 16 are attached to the exposed internal bump connecting pads 17 by means of a solder adhesive 20 composed of Pb or Sn. A molding resin 14 encapsulates the semiconductor chip 11 by surrounding the same on the entire surface of the above construction except for the top surface of the internal bumps 16, and the external bumps 15 are attached to the internal bumps 16.

As described above, a bump bonding pattern for transmitting an electrical signal of the chip pads 12 to the external bumps 15 is formed through a separate formation process of a metal wiring pattern (a pre-assembly process). The metal wiring pattern 13 is formed from the chip pads 12 of the semiconductor chip 11 to the internal bump connecting pads 17 to be electrically connected, respectively, and the conductive internal bumps 16 are attached to the internal bump connecting pads 17. The molding resin 14 surrounds and seals the above entire construction, and the external bumps 15, serving as external leads, are attached to the internal bumps 16 to form a completed chip-size semiconductor package. Although the PMEB-type chip-size semiconductor package allows the overall size of the entire semiconductor package to be smaller, a separate formation process for the metal wiring pattern (pre-assembly process in the published data) and an bonding process for internal and external bumps are necessary. Further, the fabrication process is complicated and the fabrication cost is increased.

The above references are incorporated by reference herein where appropriate for appropriate teachings of additional or alternative details, features and/or technical background.

SUMMARY OF THE INVENTION

An object of the present invention is to solve the problems of the related art.

An object of the present invention is to minimize the size of a semiconductor package.

Another object of the present invention is to facilitate the provision of numerous pins of a package.

Another object of the present invention is to simplify the fabrication process.

A further object of the present invention is to enhance the electrical characteristics of the chip package.

Still another object of the present invention is to form the shortest conductive or electrical path for transmitting signals sent from the chip pads of the integrated circuit.

To achieve the above object, there is provided a semiconductor chip package, comprising a semiconductor chip having a plurality of chip pads formed thereon; a passivation film formed on the semiconductor chip with the chip pads exposed; a plurality of metal wirings coupled to the chip pads on the passivation film; external balls electrically connected to the metal wirings; and a molding resin layer formed on a first surface of the semiconductor chip such that upper portions of the external balls protrude from the molding resin layer.

To achieve the above object, there is provided an improved fabrication method for making a semiconductor package, comprising the steps of forming a passivation film on a first surface of a wafer such that a plurality of chip pads of the wafer are exposed; forming a metal layer on the passivation film; forming a patterned photoresist layer on the metal layer, etching the metal layer by using the photoresist layer as a mask, stripping the photoresist layer and forming a patterned metal wiring conductively coupled to the plurality of chip pads; printing a solder paste on each metal wiring, mounting a solder ball, performing an infrared reflow process, removing a remaining solder paste, and attaching the solder ball serving as an external ball to each metal wiring; forming a molding resin layer on the wafer and metal wiring by performing a first molding process with a resin such that an upper portion of the solder ball is exposed; carrying out a foil mounting on a second surface of the wafer; and cutting the wafer into a semiconductor chip package.

To achieve such objects, advantages and features in part or in whole, the present invention includes a chip package, comprising an integrated chip having a plurality of chip pads on a first surface; a passivation film formed on the first surface of the integrated chip with the plurality of chip pads exposed; a plurality of conductive wires formed on the passivation film such that a corresponding conductive wire is conductively coupled to a corresponding chip pad; a plurality of conductive media, each having a first prescribed height and a corresponding conductive media being formed on a corresponding conductive wire; and a molding layer formed on the plurality of conductive wires, the molding layer having a prescribed thickness which is less than the prescribed height such that portions of the plurality of conductive media protrude from the molding layer.

The present invention may be achieved in whole or in part by a method for fabricating a chip package comprising the steps of: a) forming a passivation film on a wafer having a plurality of individual integrated chips with a plurality of chip pads exposed on a first surface of the plurality of individual integrated chips; b) forming a plurality of conductive wires on the first surface of each individual integrated chip to couple corresponding chip pads to corresponding conductive wires; c) forming a plurality of conductive media, each having a first prescribed height and a corresponding conductive media being formed on a corresponding conductive wires of each individual integrated chip; and d) forming a molding layer on the plurality of conductive wires, the molding layer having a prescribed thickness which is less than the prescribed height such that portions of the plurality of conductive media protrude from the molding layer of each individual integrated chip.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 4A and 4B are longitudinal cross-sectional views of FIG. 3, wherein FIG. 4A is a longitudinal cross-sectional view of a chip pad and FIG. 4B is that of an external ball according to an embodiment of the present invention;

FIGS. 8A and 8B are longitudinal cross-sectional views of FIG. 7, wherein FIG. 8A is a longitudinal cross-sectional view of a chip pad and FIG. 8B is that of an external ball according to another embodiment of the present invention;

DETAILED DESCRIPTION OF PREFERRED EMBODIMENTS

Figure 1:
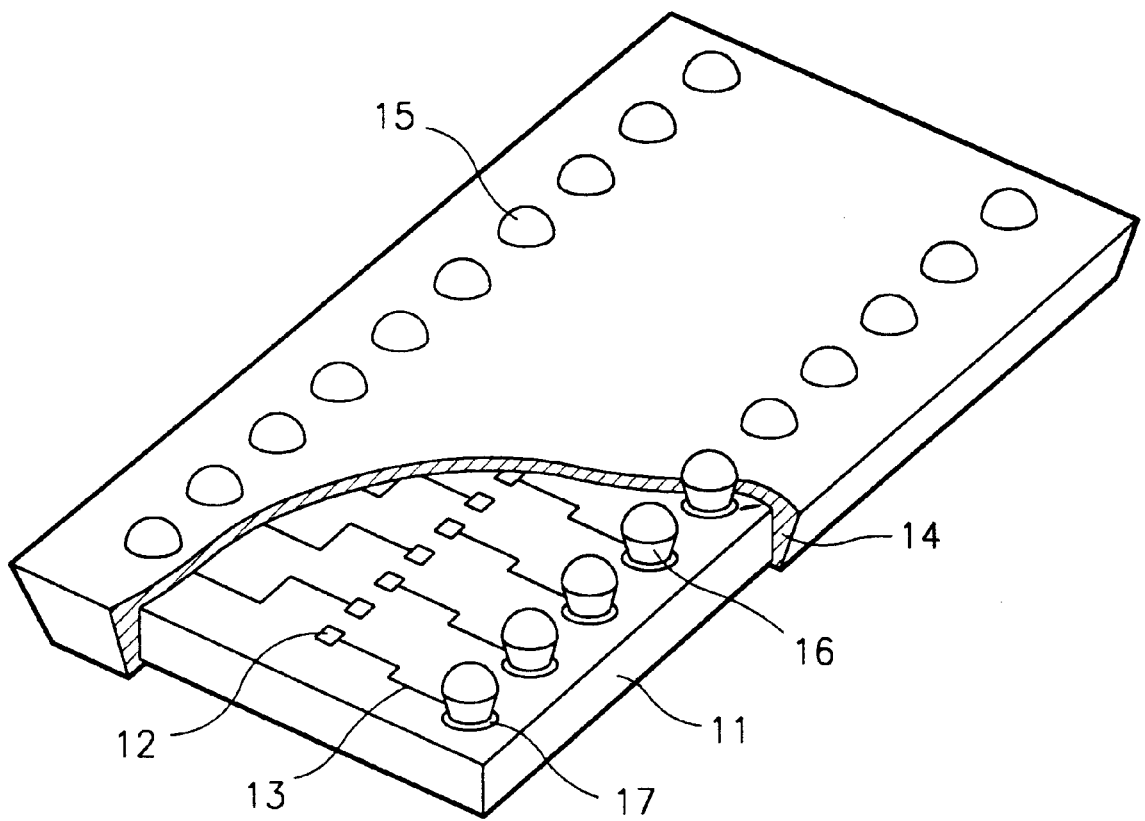
FIG. 1 is a perspective view showing the partly cut away PMEB (Plastic Molded Extended Bump) type chip-size semiconductor package according to the related art.
Figure 2:
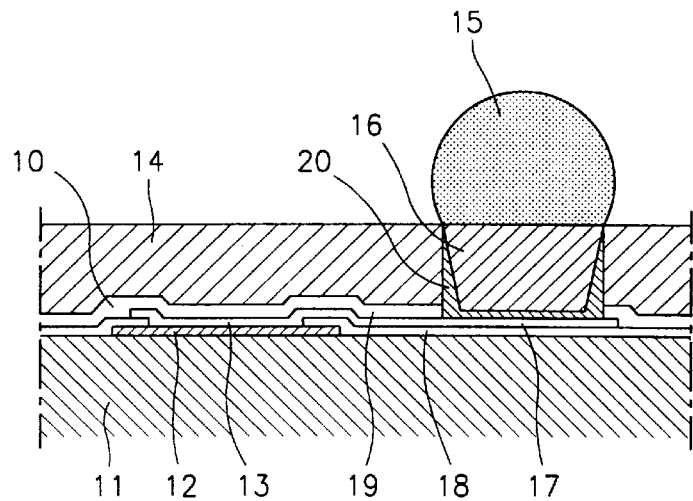
FIG. 2 is a cross-sectional view showing a portion of a bump electrode in FIG. 1 according to the related art.
Figure 3:
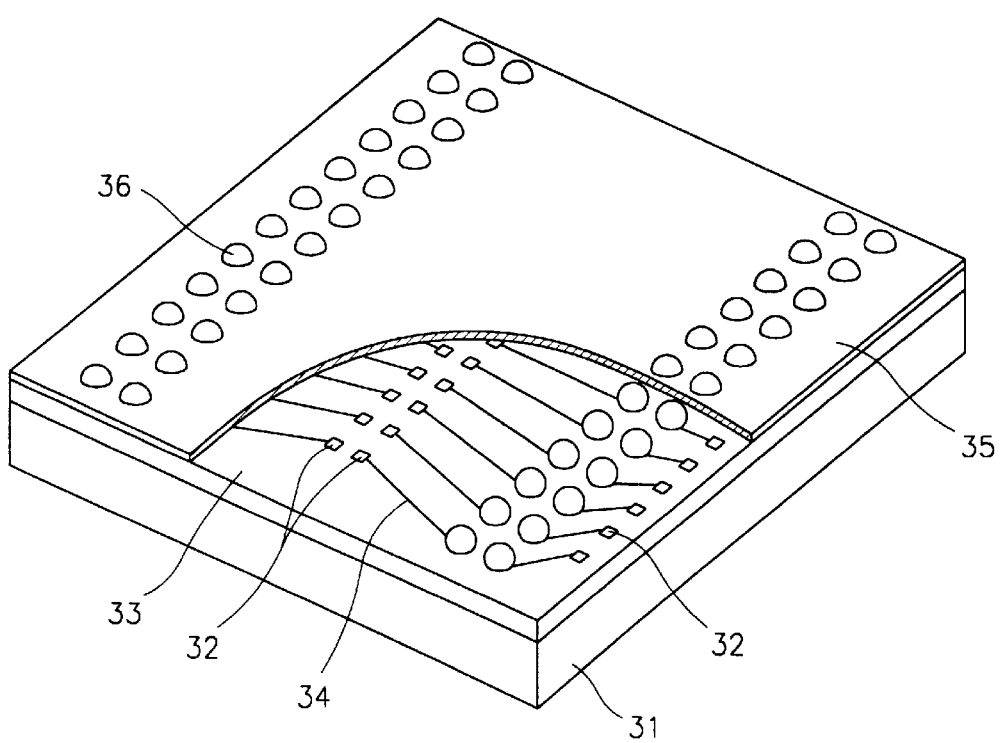
FIG. 3 is a perspective view showing a partly cut away chip-size semiconductor package according to an embodiment of the present invention.

FIG. 3 is a perspective view showing a partly cut away chip-size semiconductor package according to an embodiment of the present invention. As shown in this drawing, a plurality of chip pads 32 is formed on the upper surface of an integrated chip, i.e., a semiconductor chip, and a passivation film 33 is formed in such a manner that the chip pads 32 are exposed. A plurality of metal wirings 34 connected to the chip pads 32 are formed on the passivation film. On the metal wirings, external balls 36 are conductively coupled, e.g., electrically connected, to the metal wirings. A molding layer 35 of, e.g., resin, is formed on the upper surface of the semiconductor chip 31 such that the upper portions of the external balls 36 protrude therefrom. A preferred material for the metal wiring 34 is copper (Cu) or gold (Au).

Figure 4A:
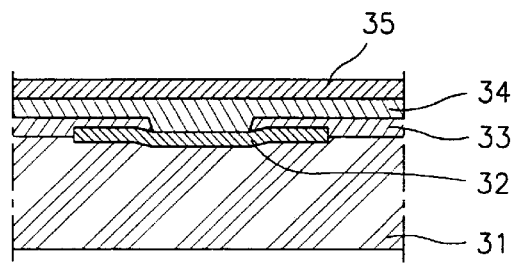
Figure 4B:
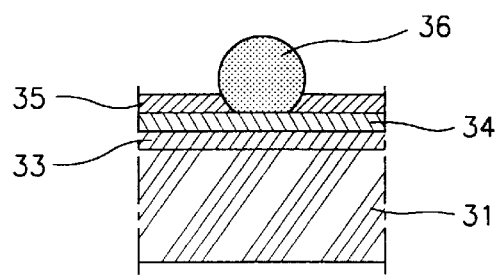

FIGS. 4A and 4B are longitudinal cross-sectional views showing a partly portion of FIG. 3, wherein FIG. 4A is a longitudinal cross-sectional view of a chip pad and FIG. 4B is that of an external ball. As shown in these drawings, the passivation film 33 is formed in such a manner that the chip pad 32 formed on the upper surface of the semiconductor chip 31 is exposed, and the metal wiring 34 connected to the chip pad 32 is formed on the passivation film 33 with the external ball 36 attached to the metal wiring 34. On the upper portion of the semiconductor chip 31, the molding resin layer 35 for protecting the metal wiring 34 and the chip pad 31 is formed. Preferably, the molding resin lay 35 has a thickness of about half the height of the external balls 36.

Figure 5:
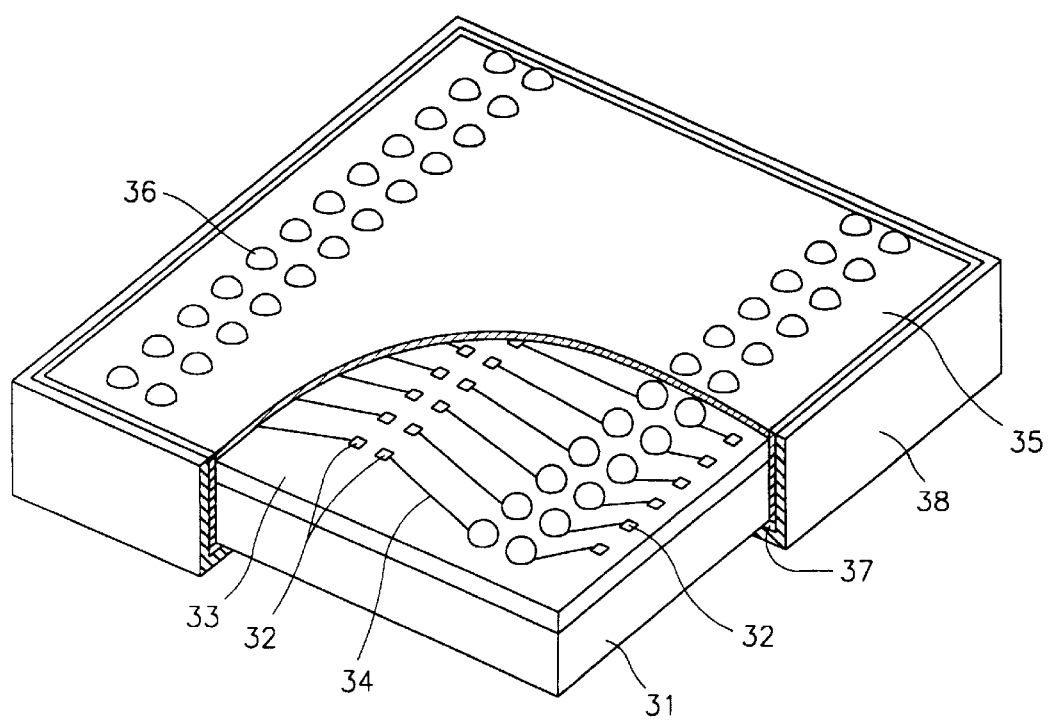
FIG. 5 is a perspective view showing a partly cut away chip-size semiconductor package according to another embodiment of the present invention in FIG. 3.

FIG. 5 is a perspective view showing a partly cut away chip-size semiconductor package according to another embodiment of the present invention in FIG. 3. As shown in this drawing, the semiconductor chip 31 is attached to an inner bottom surface of an outer protection member or plate 38 in the shape of a cavity or a recess, and a resin 37 seals the gap between the sides of the semiconductor chip 31 and the outer protection plate 38. The outer protection plate 38 is preferable since it protects the bottom surface and sides of the semiconductor chip 31. The other structures of the elements are the same as that of FIG. 3.

Figure 6:
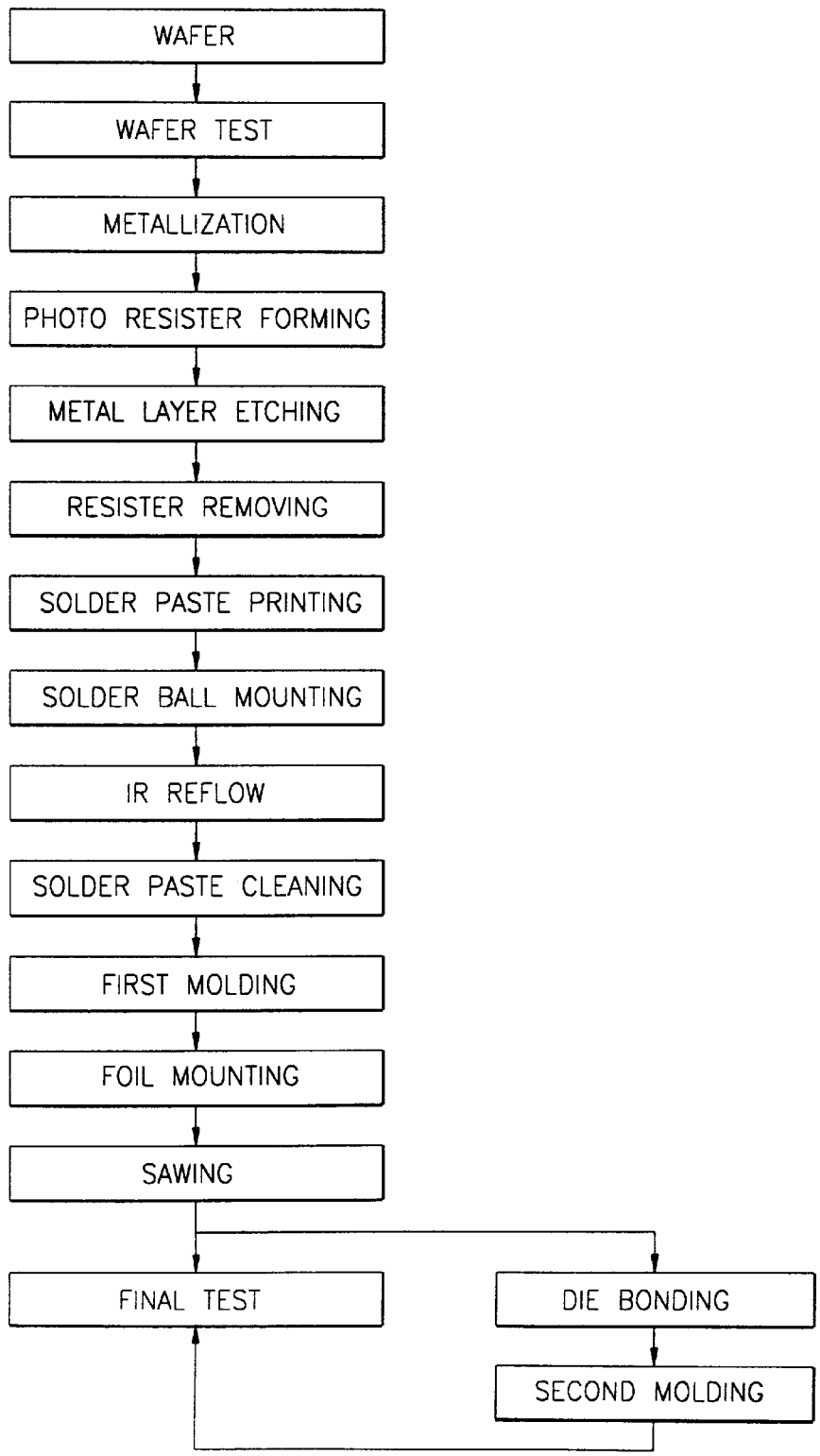
FIG. 6 is a flow chart for explaining the process of a fabrication method for a chip-size semiconductor package according to an embodiment of the present invention.

FIG. 6 is a flow chart of the method for fabricating a chip-size semiconductor package according to an embodiment of the present invention. First, a passivation film is formed on a wafer so that a plurality of chip pads are exposed and the wafer is prepared for testing. Then, a metal layer is formed on the upper surface of the wafer, and a patterned photoresist layer is formed thereon. The metal layer is etched using the photoresist layer as a mask, and then the photoresist layer is stripped, resulting in the formation of a patterned metal wiring electrically connected to each chip pad.

Next, solder pastes are printed on each metal wiring to mount solder balls (external balls), and an infrared rays reflow is performed. Then, a residual paste is rinsed and the solder balls serving as an external ball are attached to each metal wiring.

A first molding process is carried out to form a molding resin layer having a thickness of about half the height of the solder ball. Next, a foil mounting process is performed on the bottom of the wafer, and then a sawing process of cutting the wafer into an individual semiconductor chip is performed. Finally, the foil is removed to complete a chip-size semiconductor package shown in FIG. 3 The first molding process can be carried out after the sawing process is performed. A chip-size semiconductor package shown in FIG. 3 can be applied to many uses which do not require sensitive thermal characteristics.

After the sawing process, a die bonding process for attaching the bottom surface of each semiconductor chip to the inner bottom surface of the outer protection plate having a cavity or a recess shape and a second molding process for sealing the gap between the sides of the semiconductor chip and the outer protection plate with a molding resin are carried out to complete a chip-size semiconductor package in FIG. 5. The first molding process can be performed together with the second molding process. The chip-size semiconductor package in FIG. 5 has an improved thermal characteristic due to a safe protection of the surface of the semiconductor chip, resulting in enhancing a reliability of the package.

Figure 7:
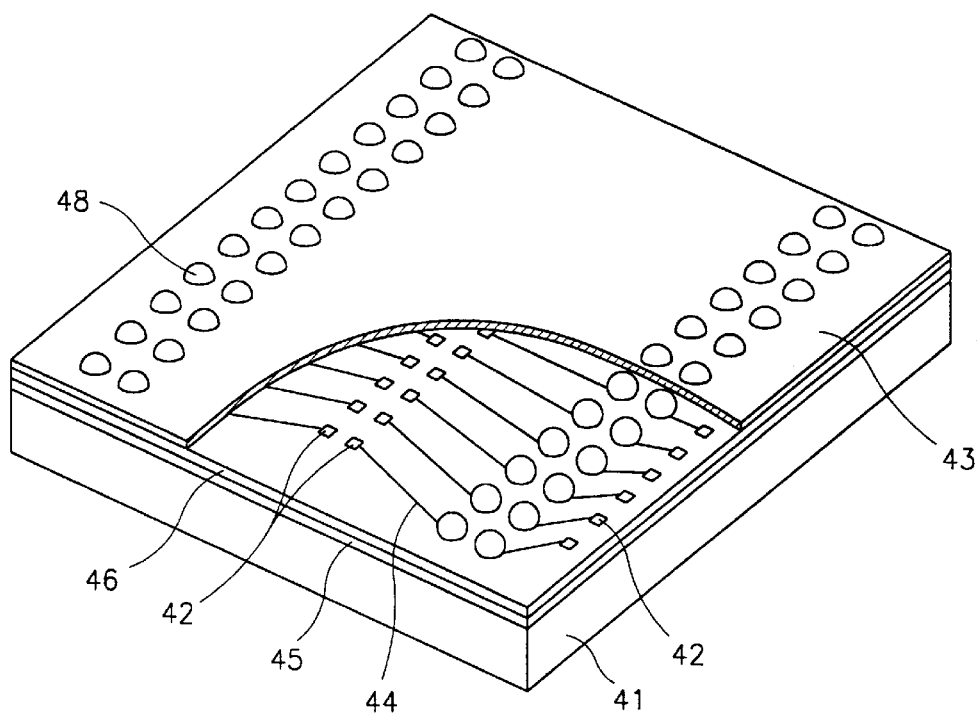
FIG. 7 is a perspective view showing a partly cut away chip-size semiconductor package according to another embodiment of the present invention.

FIG. 7 is a perspective view showing a partly cut away chip-size semiconductor package according to another embodiment of the present invention. As shown in this drawing, a passivation film 45 is formed in such a manner that a plurality of chip pads 42 formed on the upper surface of the semiconductor chip 41 are exposed. Metal wirings 44, connected to each chip pad 42, are attached to the passivation film 45 with an adherent 46. On the metal wirings 44, external balls 48 electrically connected thereto are formed, and a molding resin layer 43 is formed on the upper portion of the semiconductor chip 41 in such a manner that the upper portions of the external balls 48 protrude therefrom. The metal wirings 44 are patterned to be a separate metal wiring pattern, the material of which is composed of copper (Cu) or gold (Au).

Figure 8A:
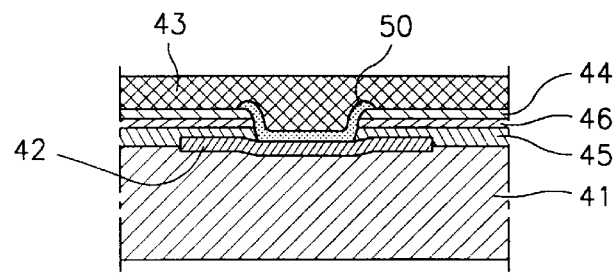
Figure 8B:
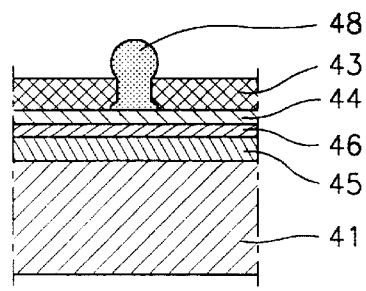

FIGS. 8A and 8B are longitudinal cross-sectional views of FIG. 7, wherein FIG. 8A is a longitudinal cross-sectional view of a chip pad and FIG. 8B is that of an external ball according to another embodiment of the present invention. As shown in these drawings, the passivation film 45 is formed in such a manner that each chip pad 42 formed on the upper surface of the semiconductor chip 41 is exposed, and the metal wirings 44 are attached with an adherent 46 to the passivation film 45. On the passivation film 45, the metal wirings 44 are attached with the adherent 46, and the metal wirings and the chip pads 42 are electrically connected by a connecting member 50, e.g., metal. An inner end of the external ball 48 is attached to the metal wiring 44 electrically connected to the chip pad 42, and the molding resin layer 43 is formed to protect the metal wiring 44 and the chip pad 42 in such a manner that an outer end of the external ball 48 protrudes out of the molding resin layer 43.

Figure 9:
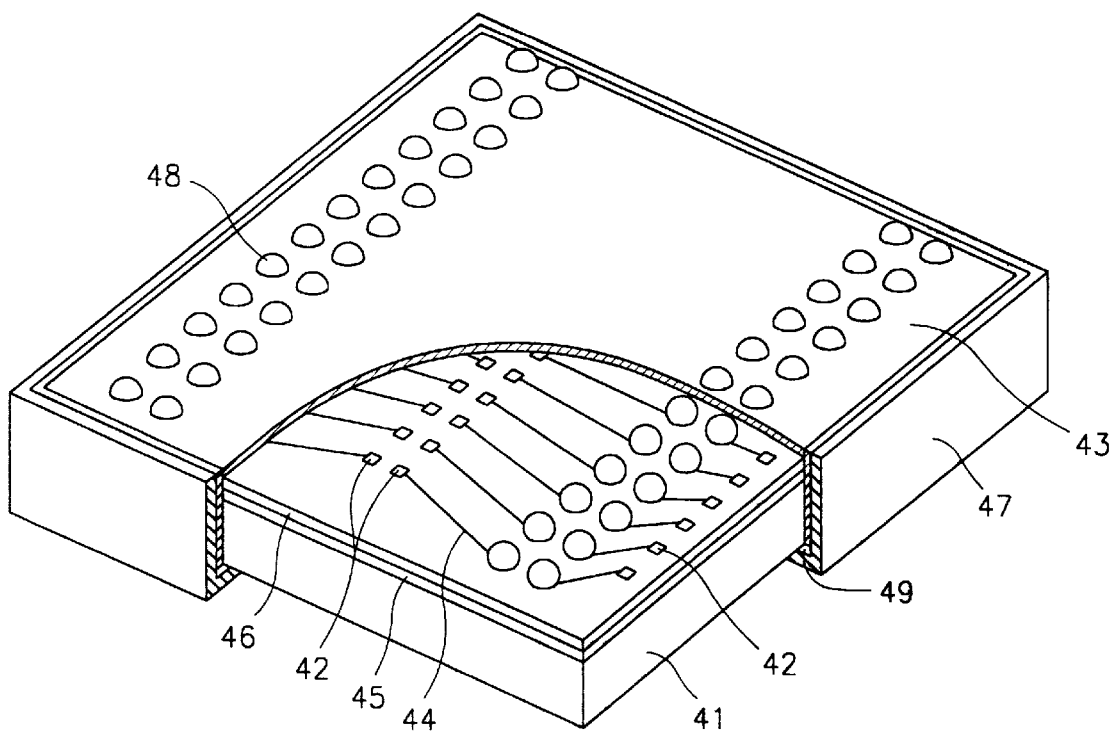
FIG. 9 is a perspective view showing a partly cut away chip-size semiconductor package according to another embodiment of the present invention in FIG. 7.

FIG. 9 is a perspective view showing a partly cut away chip-size semiconductor package according to another embodiment of the present invention in FIG. 7. As shown in this drawing, the semiconductor chip 41 is attached with an adherent 49 to the inner bottom surface of an external protection plate 47 in the shape of a cavity or a recess, a molding resin seals the gap between the sides of the semiconductor chip 41 and the external protection plate 47 so that the bottom surface and sides of the semiconductor chip 41 are enclosed for protection. The other structures are the same as those of FIG. 7.

Figure 10:
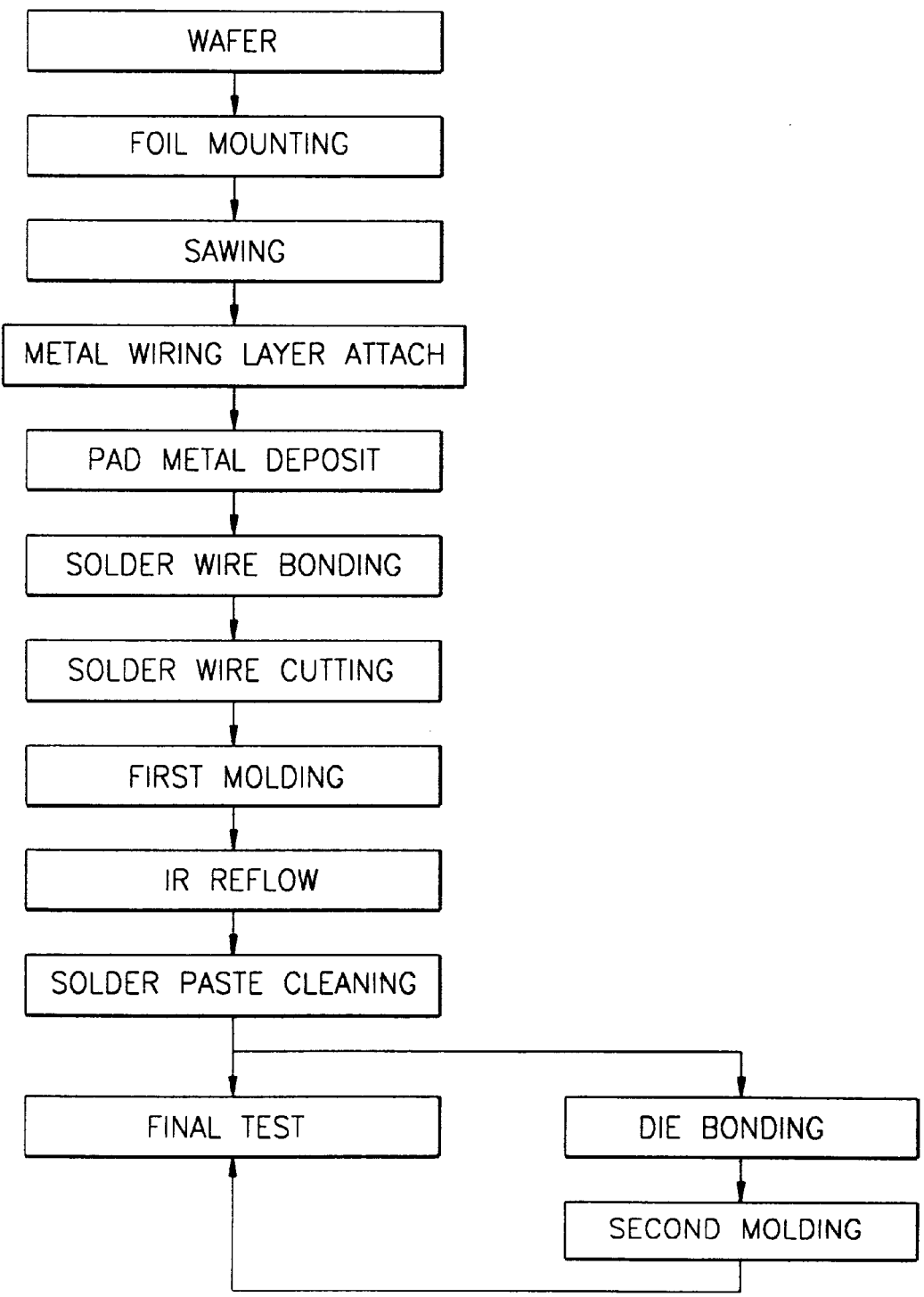
FIG. 10 is a flow chart for explaining the process of a fabrication method for the chip-size semiconductor package according to another embodiment of the present invention.

FIG. 10 is a flow chart of the method for fabricating the chip-size semiconductor package according to another embodiment of the present invention. First, a wafer is prepared on which a passivation film (Passivation +PIQ or Passivation only) is formed in such a manner that a plurality of chip pads are exposed. Then, a foil mounting is performed on the bottom surface of the wafer, and a sawing process is carried out to cut the wafer into an individual semiconductor chip. A separate metal wiring layer is attached to the semiconductor chip with an adherent, and then a metal deposition process is performed to connect each metal wiring and chip pad formed on the semiconductor chip.

Then, an inner end of a solder wire is attached to the metal wiring, and the solder wire is cut to have a predetermined length. Then a first molding process is carried out to mold the upper surface of the semiconductor chip with a molding resin. Here, the solder wire is molded in such a manner that an outer end thereof protrudes therefrom.

The external solder wire is shaped into a ball by carrying out an infrared reflow process, and a residual solder paste is removed. A final check is performed to complete a chip-size semiconductor package in FIG. 7. Such a chip-size semiconductor package can be applied to many uses which do not require sensitive thermal characteristics.

After the removing of the remaining solder paste is done, a die bonding process is performed such that the bottom surface of each semiconductor chip is attached to the inner bottom surface of the external protection plate in the shape of a cavity or recess. A second molding process is carried out such that the gap between the external protection plate and the semiconductor chip is completely sealed with a molding resin. Then, a final test is conducted to complete a chip-size semiconductor package of FIG. 9. The reliability of the semiconductor package of FIG. 9 can be enhanced since the surface of the semiconductor chip is safely protected and consequently the thermal characteristic is improved.

As described in detail above, the chip-size semiconductor package and the fabrication method thereof according to an embodiment of the present invention has the advantages as follows:

Since the direct attaching of the external balls to the metal wiring removes the necessity of an internal bump in the conventional PMEB package, the fabrication method is simplified. Since the arrangement of the external balls can be made irrespective of the position of the chip pads, the design of the package can be made easy. Further, since the size of the semiconductor package which is nearly the chip size can be fabricated, the mounting rate can be advantageously raised to the maximum, and a plurality of external balls can be effectively formed.

Further, the attachment of the patterned metal wiring layer on the semiconductor with an adherent removes the necessity of a separate process of a metal wiring formation (pre-assembly process in the conventional PMEB), the fabrication method can be simplified. A separate base frame is also advantageously not necessary to form an internal bump in the conventional PMEB package according to the present invention.

The foregoing embodiment is merely exemplary and not to be construed as limiting the present invention. The present scheme may be readily applied to other types of packages. In the foregoing embodiments, the surfaces were referred to as upper and lower surfaces or top and bottom surfaces for convenience to illustrate the present invention in view of the figures. As can be appreciated, the surface reference is dependent upon the orientation of the package. Moreover, the present invention is applicable for packaging various integrated chips, and various conductive materials can be used for conductive coupling, including metal and solder. The description of the present invention is intended to be illustrative, and not limiting the scope of the claims. Many alternatives, modifications and variations will be apparent to those skilled in the art.

What is claimed is:

1. A method for making a semiconductor package, comprising:

forming a passivation film on a first surface of a wafer such that a plurality of chip pads of the wafer are exposed;

forming a metal layer on the passivation film;

forming a patterned photoresist layer on the metal layer, etching the metal layer by using the photoresist layer as a mask, stripping the photoresist layer and forming a plurality of patterned metal wirings conductively coupled to the plurality of chip pads;

printing a solder paste on each one of the plurality of metal wirings, mounting a solder ball, performing an infrared reflow process, removing a remaining solder paste, and attaching the solder ball serving as an external ball to each one of the plurality of metal wirings;

forming a molding resin layer on the wafer and the metal wiring by performing a first molding process with a resin such that an upper portion of the solder ball is exposed;

carrying out a foil mounting on a second surface of the wafer; and cutting the wafer into a chip package.

2. The method of claim 1, further comprising:

a die bonding for bonding the second surface of each semiconductor chip to an outer protection plate having a cavity shape; and a second molding for sealing a gap between sides of the semiconductor chip and the outer protection plate with a molding resin.

3. A method of fabricating a semiconductor chip package, comprising:

carrying out a foil mounting on a first surface of a wafer on which a passivation film is formed on a second surface of the wafer such that a plurality of chip pads are exposed and cutting the wafer into an individual semiconductor chip;

attaching a separate metal wiring layer to the passivation film of the individual semiconductor chip with an adherent;

coupling the metal wiring layer and each chip pad formed on the semiconductor chip;

attaching an inner end of the solder wire to each metal wiring and cutting the solder wire to have a predetermined length;

performing a first molding process for molding the second surface of the semiconductor chip such that an outer end of the solder wire protrudes from a molding resin;

carrying out an infrared reflow for forming the outer end of the solder wire into a ball shape; and removing the remaining solder paste.

4. The method of claim 3, further comprising:

bonding the first surface of the individual semiconductor chip to the outer protection plate having a cavity shape and a second molding for sealing a gap between a side of the individual semiconductor chip and the outer protection plate with a molding resin.

5. A method for fabricating a chip package, comprising:

a) forming a passivation film on a wafer having a plurality of individual integrated chips with a plurality of chip pads exposed on a first surface of the plurality of individual integrated chips;

b) forming a plurality of conductive wires on the first surface of each individual integrated chip to couple corresponding chip pads to corresponding conductive wires;

c) forming a plurality of conductive media, each having a first prescribed height and a corresponding conductive media being formed on a corresponding conductive wires of each individual integrated chip; and d) forming a molding layer on said plurality of conductive wires, said molding layer having a prescribed thickness which is less than the prescribed height such that portions of said plurality of conductive media protrude from said molding layer of each individual integrated chip.

6. The method of claim 5, further comprising:

foil mounting the wafer; and cutting the wafer into individual integrated chips.

7. The method of claim 5, wherein the step of forming the plurality of conductive wires comprises:

forming a conductive layer on the plurality of individual integrated chips;

forming a patterned photoresist layer on the conductive layer;

etching the conductive layer using the patterned photoresist layer as a mask to form the plurality of conductive wires such that the plurality of chip pads is conductively coupled to the plurality of conductive wires; and removing the patterned photoresist layer.

8. The method of claim 5, wherein the step of forming the plurality of conductive wires comprises:

attaching a patterned conductive wiring layer onto the passivation film of each individual integrated chip using an adherent; and deposition of a conductive material to connect the patterned conductive wiring layer to corresponding chip pads of each individual integrated chip.

9. The method of claim 5, wherein the step of forming the plurality of conductive media comprises:

printing a solder paste on corresponding conductive wires;

mounting the plurality of conductive media on the solder paste of corresponding conductive wires; and reflowing the solder paste and the plurality of conductive media to attach the plurality of conductive media to the corresponding conductive wires, wherein the step (c) is performed before step (d).

10. The method of claim 5, wherein the step of forming the plurality of conductive media comprises:

bonding a solder wire to corresponding conductive media of each individual integrated chip;

cutting the solder wire; and reflowing the solder wire after step (d).

11. The method of claim 6, further comprising:

bonding a second surface of the individual integrated chip to a protection member.

12. The method of claim 11, wherein the protection member includes a recess to enclose the second surface and side surfaces of the individual integrated chip, and further comprises the step of filling any gaps between the protection member and the individual integrated chip with resin.

13. A method for making a semiconductor package, comprising:

forming a passivation film on a first surface of a wafer such that a plurality of chip pads of the wafer are exposed;

forming a plurality of patterned metal wiring layers on the passivation film conductively coupled to a corresponding one of the plurality of chip pads;

attaching a plurality of solder balls to each one of the plurality of metal wiring layers; and forming a molding resin layer on the wafer and metal wiring such that an upper portion of each one of the plurality of solder balls is exposed.

* * * * *